United States Patent [19]

Sakamoto

[11] Patent Number: 4,940,951
[45] Date of Patent: Jul. 10, 1990

[54] PHASE LOCK RECOVERY APPARATUS FOR PHASE LOCKED LOOP CIRCUIT

[75] Inventor: Yoshiaki Sakamoto, Saitama, Japan

[73] Assignee: Kabushiki Kaisha Toshiba, Kanagawa, Japan

[21] Appl. No.: 302,714

[22] Filed: Jan. 27, 1989

[30] Foreign Application Priority Data

Feb. 1, 1988 [JP] Japan .................. 63-22312

[51] Int. Cl.⁵ .................. H03L 7/12; H04L 27/22
[52] U.S. Cl. .................. 331/4; 329/307;
331/17; 331/DIG. 2; 375/81; 375/120
[58] Field of Search .................. 331/4, DIG. 2, 17;
329/122, 124, 307, 308, 309, 325, 326; 375/81, 120

[56] References Cited

U.S. PATENT DOCUMENTS

| | | | |
|---|---|---|---|
| 3,793,594 | 2/1974 | Griswold | 331/4 |
| 4,316,154 | 2/1982 | Krause | 331/4 |
| 4,388,598 | 6/1983 | Egan | 331/4 |
| 4,527,127 | 7/1985 | Brown | 329/122 |
| 4,713,630 | 12/1987 | Matthews | 331/4 |
| 4,814,719 | 3/1989 | Guyer | 331/4 X |

FOREIGN PATENT DOCUMENTS

| | | |
|---|---|---|
| 0098705 | 1/1984 | European Pat. Off. . |
| 0243589 | 11/1987 | European Pat. Off. . |
| 1266344 | 4/1968 | Fed. Rep. of Germany . |
| 2812377 | 6/1983 | Fed. Rep. of Germany . |
| 1528643 | 10/1978 | United Kingdom . |

OTHER PUBLICATIONS

Patent Abstracts of Japan, vol. 12, No. 167 (E-610) to Daimon, published May 19, 1988.

Primary Examiner—Siegfried H. Grimm
Attorney, Agent, or Firm—Finnegan, Henderson, Farabow, Garrett, and Dunner

[57] ABSTRACT

A phase lock recovery apparatus for a phase locked loop circuit having a voltage controlled oscillator. The apparatus includes a detection circuit coupled to the phase locked loop circuit for detecting a phase unlocked state occurred in the phase locked loop circuit and a sweep signal generator responsive to the detection circuit for sweeping the frequency of the voltage controlled oscillator to come within the lock range of the frequency of the input signal when the phase unlocked state is detected.

4 Claims, 4 Drawing Sheets (Prior Art) FIG.1.

PHASE LOCK RECOVERY APPARATUS FOR PHASE LOCKED LOOP CIRCUIT

FIELD OF THE INVENTION

The present invention relates generally to a phase locked loop circuit, and more particularly, to a phase lock recovery apparatus for a phase locked loop circuit.

BACKGROUND OF THE INVENTION

Conventionally, a quarternary phase-shift keying telecommunication system (referred as QPSK system) is widely used in digital telecommunication systems.

In the QPSK system, a carrier wave is phase-modulated by a digital signal, e.g., a pulse code modulation signal (referred as PCM signal hereafter) in the well-known quarternary phase-shift keying QPSK manner at a transmitter. Thus, a QPSK modulation wave is produced in the transmitter. The QPSK modulation wave is transmitted to a receiving station, such as a QPSK system receiver. The QPSK system receiver reproduces the carrier wave from the received QPSK modulation wave. Then, the receiver demodulates the PCM signal from the received QPSK modulation wave by a synchronous demodulation using the reproduced carrier wave.

The reproduction of the carrier wave in the QPSK system receiver is carried out by using a phase locked loop (referred as PLL hereafter) circuit, as is well known.

When such a QPSK demodulation is performed through the synchronous demodulation at the QPSK system receiver in a communication system using a carrier, it is necessary to reproduce a carrier wave in the same standard phase as the carrier wave used in the transmitter.

Figure 1:
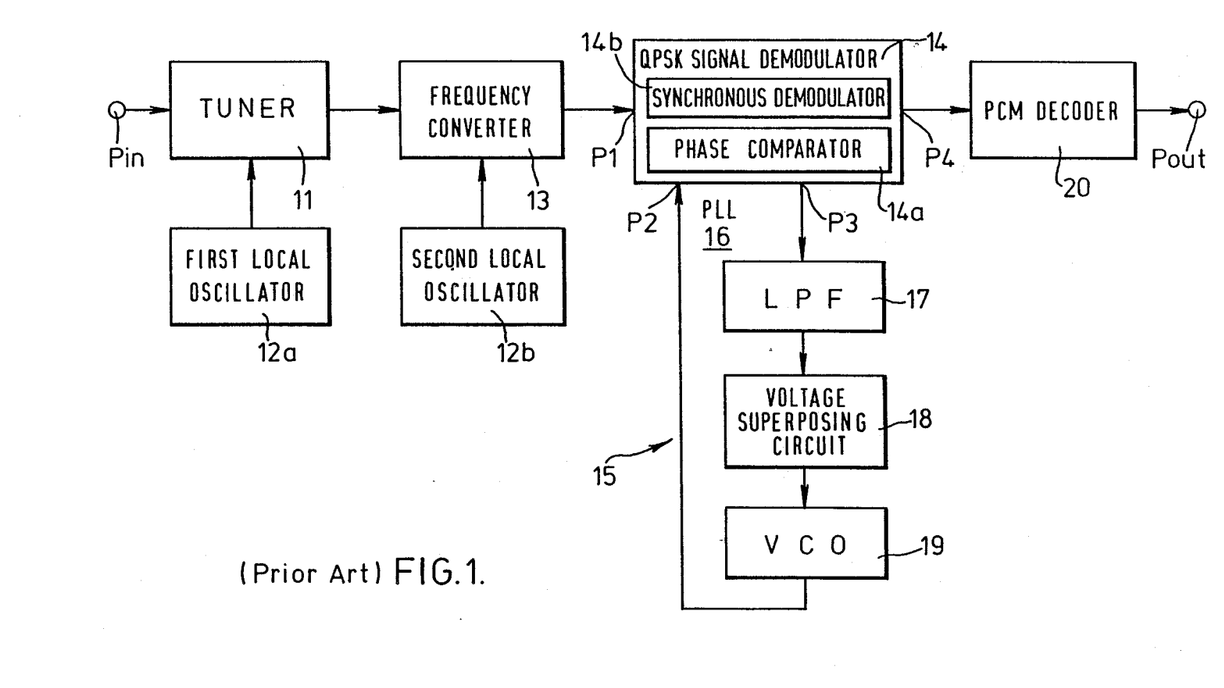
FIG. 1 is a block diagram showing a conventional QPSK system receiver.

FIG. 1 is a block diagram showing an example of the QPSK system receiver which performs such a QPSK demodulation for reproducing the carrier wave and for demodulating the PCM signal from the received QPSK modulation wave. In the QPSK system, the QPSK modulation wave carrying the PCM signal is supplied to the QPSK system receiver. The PCM signal has, e.g., two channel digital signals being transmitted via a cable from a transmitter.

In FIG. 1, the QPSK modulation wave is input to an input terminal Pin of the QPSK system receiver. The QPSK modulation wave input to the QPSK system receiver is applied to a tuner 11. The tuner 11 shifts down the high frequency of the QPSK modulation wave, i.e., the RF (radio frequency) signal, to a first prescribed IF (intermediate frequency) signal. A first local oscillator 12a supplies a first local frequency signal with a prescribed variable frequency to the tuner 11. The frequency of the first local frequency signal varies in accordance with a tuning operation so that a desired one of the QPSK modulation waves input to the QPSK system receiver is tuned by the tuner 11. Thus, the tuned QPSK modulation wave, i.e., the RF signal is converted to the first IF signal.

The first IF signal output from the tuner 11 is applied to a frequency converter 13. The frequency converter 13 again shifts down the frequency of the first IF signal to a second prescribed IF signal. A second local oscillator 12b supplies a second local frequency signal with a prescribed fixed frequency to the frequency converter 13. The circuit consisting of the tuner 11, the first and second local oscillators 12a, 12b and the frequency converter 13 forms a well-known double frequency conversion system. Thus, the frequency converter 13 outputs a second IF signal lower in frequency than the first IF signal.

The second IF signal is applied to a first input terminal P1 of a QPSK signal demodulator 14. The QPSK signal demodulator 14 constitutes an integrated circuit comprising a phase comparator section 14a and a synchronous demodulator section 14b.

The phase comparator section 14a compares the phase of the second IF signal which represents the QPSK modulation signal transmitted from the transmitter with a phase signal as described below, which is supplied to a second input terminal P2 of the QPSK signal demodulator 14. Thus, the phase comparator section 14a outputs a phase error signal between the QPSK modulation signal and the phase signal from a first output terminal P3 of the QPSK signal demodulator 14.

The synchronous demodulator section 14b demodulates the PCM signal from the QPSK modulation signal in synchronism with the phase signal.

The QPSK signal demodulator 14 is coupled to a carrier wave reproducing circuit 15. The carrier wave reproducing circuit 15 forms a PLL circuit 16 together with the phase comparator section 14a in the QPSK signal demodulator 14. The carrier wave reproducing circuit 15 comprises a low pass filter (referred as LPF hereafter) 17, a voltage superposing circuit 18 and a voltage controlled oscillator (referred as VCO hereafter) 19.

The phase error signal output from the phase comparator section 14a in the QPSK signal demodulator 14 is applied to the LPF 17. The LPF 17 generates a DC signal having a level variable in correspondence with the phase error signal. The variable DC signal output from the LPF 17 is applied to the voltage superposing circuit 18. The voltage superposing circuit 18 includes therein a voltage source with a fixed voltage. The variable DC signal output from the LPF 17 is superposed on the fixed voltage of the voltage source in the voltage superposing circuit 18. Thus, the voltage superposing circuit 18 supplies a superposed voltage to the VCO 19.

The VCO 19 oscillates under the control of the superposed voltage supplied from the voltage superposing circuit 18. The VCO 19 is designed to oscillate at an oscillation frequency identical with the frequency of the carrier wave used in the transmitter, when only the fixed voltage is supplied from the voltage superposing circuit 18 without the variable DC signal. Thus, the oscillation frequency of the VCO 19 is corrected so that it becomes equal in frequency and phase to the carrier wave, in response to the DC signal output from the LPF 17.

The oscillation output (referred as VCO signal hereafter) of the VCO 19 is fed back to the phase comparator section 14a in the QPSK signal demodulator 14. The PLL circuit 16, comprising the phase comparator section 14a in the QPSK signal demodulator 14 and the carrier wave reproducing circuit 15, automatically stabilizes the phase and the frequency of the VCO signal. As a result, the carrier wave used in the transmitter is reproduced as the VCO signal by the PLL circuit 16, comprising the carrier wave reproducing circuit 15 and the phase comparator section 14a of the QPSK signal demodulator 14.

The carrier wave thus reproduced is supplied to the synchronous demodulator section 14b of the QPSK signal demodulator 14. Then the synchronous demodulator section 14b demodulates the PCM signal from the QPSK modulation wave applied to the input terminal P1 of the QPSK signal demodulator 14 in accordance with the synchronous demodulation under the control of the reproduced carrier wave. The PCM signal thus demodulated is supplied to a PCM decoder 20. The PCM decoder 20 decodes digital signals from the PCM signal. The digital signals are applied to a digital to analog converter (not shown) for converting the digital signals to corresponding analog signals through an output terminal Pout of the QPSK system receiver.

In the conventional QPSK system receiver described above, the VCO 19 utilizes a voltage control type crystal oscillator. The oscillation frequency of the crystal oscillator responding to the fixed voltage is set to a frequency the same as the frequency, e.g., 6.4 MHz, of the carrier wave of the QPSK modulation wave. The PLL circuit 16, comprising the phase comparator section 14a of the QPSK signal demodulator 14 and the carrier wave reproducing circuit 15, operates to minimize the phase error signal output from the phase comparator section 14a of the QPSK signal demodulator 14, i.e., the DC signal output from the LPF 17. Thus, the PLL circuit 16 automatically locks the phase of the reproduced carrier wave into the phase of the QPSK modulation wave.

Conventionally, the PLL circuit 16 is designed to be stable and thus is capable of accurately causing the phase of the reproduced carrier wave to lock with the phase of the QPSK modulation wave. However, if the PLL circuit 16 is designed to be stable, the effective lock range in which the phase error signal is reduced becomes narrow.

The phase error signal corresponds to the difference between phases or frequencies of the QPSK modulation wave and the VCO signal, i.e., the reproduced carrier wave output from the VCO 19. A large amount of the phase error signal occurs, for example, at the instant of power ON, during channel switching or during receipt of a foreign disturbance. Thus, the PLL circuit 16 often goes out of the phase locked state for the QPSK modulation wave, and, into a phase unlocked state. For example, if it is assumed that the QPSK modulation wave has a frequency of 450 MHz, the PLL circuit 16 typically requires a frequency lock range of more than 100 kHz. However, it is difficult to have such a wide frequency lock range and also to establish a satisfactory stability of PLL operation in the PLL circuit 16.

Further, in the conventional QPSK system receiver, it is also difficult to recover the PLL circuit 16 to the phase locked state, if the phase unlocked state has occurred.

SUMMARY OF THE INVENTION

It is an object of the present invention to provide a phase lock recovery apparatus for a PLL circuit which is stable during PLL operation and easily recovers to the phase locked state when a phase unlocked state has occurred.

In order to achieve the above object, and according to one aspect of the present invention, a phase lock recovery apparatus for a PLL circuit having a voltage controlled oscillator includes a detection circuit coupled to the PLL circuit for detecting whether a phase unlocked state occurred in the PLL circuit, and a sweep signal generator responsive to the detection circuit for sweeping the frequency of the voltage controlled oscillator to come within the lock range of the frequency of the input signal when the phase unlocked state is detected.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

The present invention will be described in detail with reference to FIG. 2 through 5. Throughout the drawings, reference numerals or letters used in FIG. 1 (Prior Art) will be used to designate like or equivalent elements for simplicity of explanation.

Figure 2:
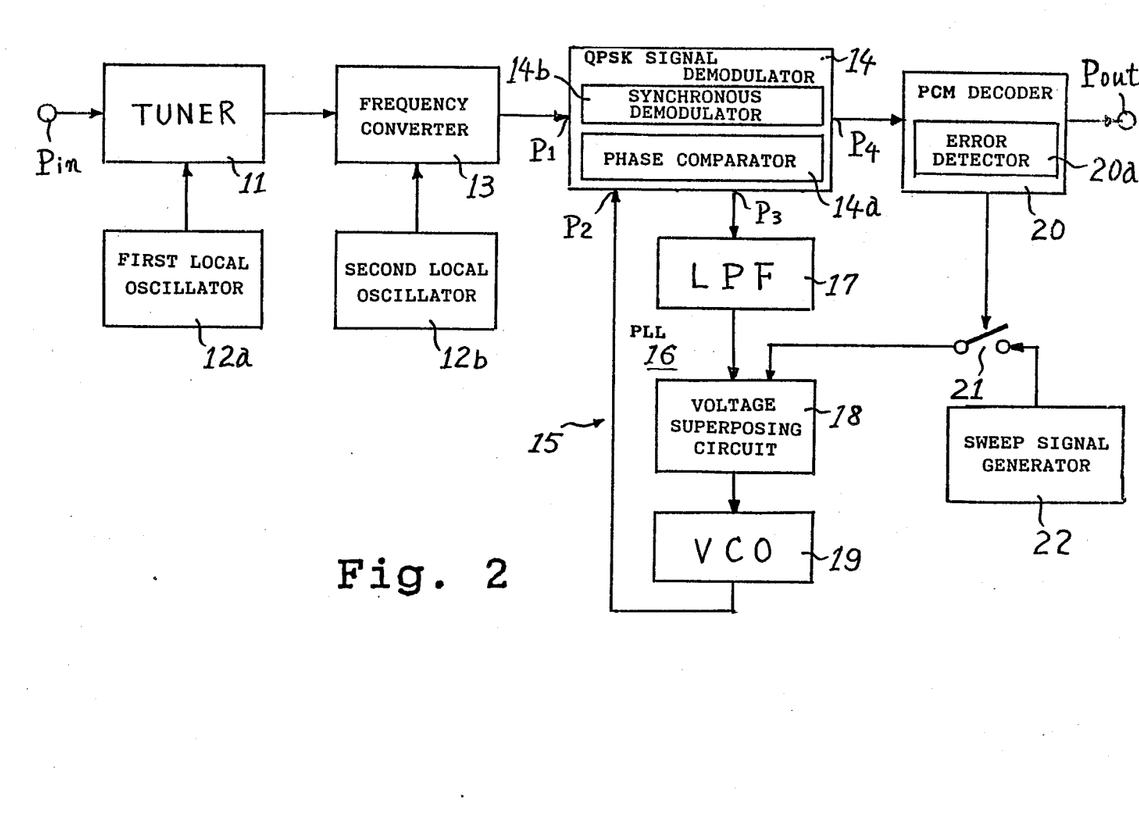
FIG. 2 is a block diagram showing a QPSK system receiver embodying the first embodiment of the phase lock recovery apparatus for a PLL circuit.

Referring now to FIG. 2, a first embodiment of the phase lock recovery apparatus for a PLL circuit according to the present invention will be described in detail. FIG. 2 shows a block diagram of a QPSK system receiver embodying the first embodiment of the phase lock recovery apparatus for a PLL circuit.

In FIG. 2, an input terminal Pin is provided for receiving a QPSK modulation wave transmitted from a QPSK signal transmitter (not shown). The QPSK modulation wave input to the terminal Pin is supplied to a tuner 11. The tuner 11 shifts down a high frequency of the QPSK modulation wave, i.e., an RF signal to a first prescribed IF signal. A first local oscillator 12a supplies a first local frequency signal with a prescribed variable frequency to the tuner 11. The frequency of the first local frequency signal varies in accordance with a tuning operation so that a desired one of the QPSK modulation wave input to the QPSK system receiver is tuned by the tuner 11. Thus, the tuned QPSK modulation wave, i.e., the RF signal is converted to the first IF signal.

The first IF signal output from the tuner 11 is applied to a frequency converter 13. The frequency converter 13 again shifts down the frequency of the first IF signal to a second prescribed IF signal. A second local oscillator 12b supplies a second local frequency signal with a prescribed fixed frequency to the frequency converter 13. The circuit consisting of the tuner 11, the first and second local oscillators 12a12b and the frequency converter 13 forms a well-known double frequency conversion system. Thus, the frequency converter 13 outputs a second IF signal lower in frequency than the first IF signal.

The second IF signal is applied to a first input terminal P1 of a QPSK signal demodulator 14. The QPSK signal demodulator 14 constitutes an integrated circuit 5 comprising a phase comparator section 14a and a synchronous demodulator section 14b. The phase comparator section 14a compares the phase of the second IF signal which represents the QPSK modulation signal transmitted from the transmitter with a phase signal as described below, which is supplied to a second input terminal P2 of the QPSK signal demodulator 14. Thus, the phase comparator section 14a outputs a phase error signal between the QPSK modulation signal and the phase signal from a first output terminal P3 of the QPSK signal demodulator 14. The synchronous demodulator section 14b demodulates the PCM signal from the QPSK modulation signal in synchronism with the phase signal.

The QPSK signal demodulator 14 is coupled to a carrier wave reproducing circuit 15. The carrier wave reproducing circuit 15 forms a PLL circuit 16 together with the phase comparator section 14a in the QPSK signal demodulator 14. The carrier wave reproducing circuit 15 comprises an LPF 17, a voltage superposing circuit 18 and a VCO 19.

The phase error signal output from the phase comparator section 14a in the QPSK signal demodulator 14 is applied to the LPF 17. The LPF 17 generates a DC signal having a level variable in correspondence with the phase error signal. The variable DC signal output from the LPF 17 is applied to the voltage superposing circuit 18. The voltage superposing circuit 18 includes a voltage source with a fixed voltage. The variable DC signal output from the LPF 17 is superposed on the fixed voltage of the voltage source in the voltage superposing circuit 18. Thus, the voltage superposing circuit 18 supplies a superposed voltage to the VCO 19.

The VCO 19 oscillates under the control of the superposed voltage supplied from the voltage superposing circuit 18. The VCO 19 is designed to oscillate at an oscillation frequency identical with the frequency of the carrier wave used in the transmitter, when only the fixed voltage is supplied from the voltage superposing circuit 18 without the variable DC signal. Thus, the oscillation frequency of a signal, i.e., a VCO signal output from the VCO 19 is corrected so that it becomes equal in frequency and phase to the carrier wave, in response to the DC signal output from the LPF 17.

The VCO signal output from the VCO 19 is fed back to the phase comparator section 14a in the QPSK signal demodulator 14. The PLL circuit 16, comprising the phase comparator section 14a of the QPSK signal demodulator 14 and the carrier wave reproducing circuit 15, automatically stabilizes the phase and the frequency of the VCO signal. As a result, the carrier wave used in the transmitter is reproduced as the VCO signal by the PLL circuit 16 comprising the carrier wave reproducing circuit 15 and the phase comparator section 14a of the QPSK signal demodulator 14.

The carrier wave thus reproduced is supplied to the synchronous demodulator section 14b of the QPSK signal demodulator 14. The synchronous demodulator section 14b demodulates the PCM signal from the QPSK modulation wave applied to the input terminal P1 of the QPSK signal demodulator 14 in accordance with the synchronous demodulation under the control of the reproduced carrier wave. The PCM signal thus demodulated is supplied to a PCM decoder 20. The PCM decoder 20 decodes digital signals from the PCM signal. The digital signals are applied to a digital to analog converter (not shown) for converting the digital signals to corresponding analog signals through an output terminal Pout of the QPSK system receiver.

The PCM decoder 20 includes therein an error detector section 20a. The error detector section 20a detects data errors when the errors occur in the PCM data output from the QPSK signal demodulator 14 or detects digital data decoded in the PCM decoder 20 itself in a manner well-known to those skilled in the art. The error detector section 20a produces an error detection pulse S1 with a high level when a prescribed amount of the errors are detected. The error detection pulse S1 is applied to a switch 21, as described later.

The errors occur in the PCM data of the digital data, when the PLL circuit 16 goes out of the phase locked state for the QPSK modulation wave and into a phase unlocked state. A large amount of the phase error signal occurs, e.g., at an instant of power ON, during channel switching or upon receipt of a foreign disturbance, as described before.

Figure 3:
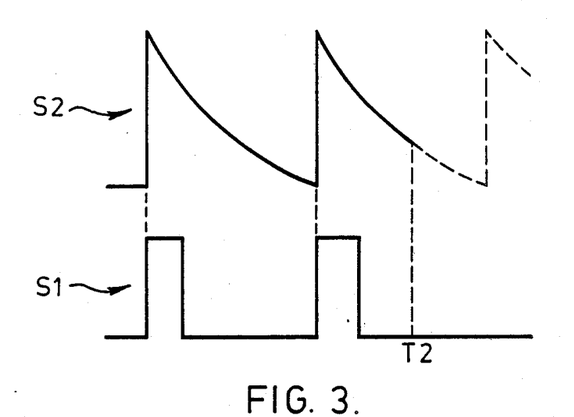
FIG. 3 is a diagram showing signals at a phase lock recovery operation of the apparatus of FIG. 2.

Now a phase lock recovery operation for the PLL circuit 16 will be described with reference to both FIG. 2 and FIG. 3. FIG. 3 is a diagram showing a relation among the error detection pulse S1 and a sweep signal S2 as described later.

The switch 21 is inserted between the voltage superposing circuit 18 in the PLL circuit 16 and a sweep signal generator 22. The sweep signal generator 22 may be constituted by, e.g., a part of a microprocessor. The sweep signal generator 22 generates the sweep signal S2, as shown in FIG. 3. The sweep signal S2 is supplied to the voltage superposing circuit 18 when the switch 21 is turned ON by the error detection pulse S1. The sweep signal S2 is added to the fixed voltage of the voltage superposing circuit 18 and varies the superposed voltage output from the voltage superposing circuit 18 in accordance with the sweep signal S2. The superposed voltage of the voltage superposing circuit 18 is supplied to the VCO 19. Thus, the frequency of the VCO signal of the VCO 19 is swept in accordance with the sweep signal supplied from the sweep signal generator 22. When the sweep voltage supplied from the voltage superposing circuit 18 reaches a prescribed level, the oscillation frequency of the VCO 19 falls into the lock range of the PLL circuit 16. The PLL circuit 16 then operates to lock the oscillation frequency of the VCO 19 to the frequency of the QPSK signals applied to the QPSK signal demodulator 14. Then, the operation of the PLL circuit 16 is in the stable phase locked state.

When the frequency of the VCO signal thus swept falls into the lock range of the PLL circuit 16 at an instant T2, as shown in FIG. 3, the PLL circuit 16 reproduces the carrier wave. Thus, the QPSK signal demodulator 14 reaches the normal demodulating condition of the correct PCM data. The error detector section 20a fails to produce the error detection signal and the switch 21 is turned OFF. As a result, the sweep signal generator 22 is disconnected from the voltage superposing circuit 18.

According to the first embodiment of the phase lock recovery apparatus for the PLL circuit, the switch 21 is turned ON by the error detection pulse S1 output from the PCM decoder 20 to supply the sweep signal S2 of the sweep signal generator 22 into the PLL circuit 16 when the PLL circuit 16 has entered into the phase unlocked state. The sweep signal S2 forcibly varies the oscillation frequency of the VCO 19. If the recovery operation is not achieved within the first cycle of sweep signal S2, the recovery operation can be made at the second or other successive cycles of the sweep signal S2. Thus, the PLL circuit 16 can quickly recover the phase locked state when the oscillation frequency is in the lock range around the frequency of the second IF signal, i.e., the QPSK modulation signal input to the QPSK signal demodulator 14.

Figure 4:
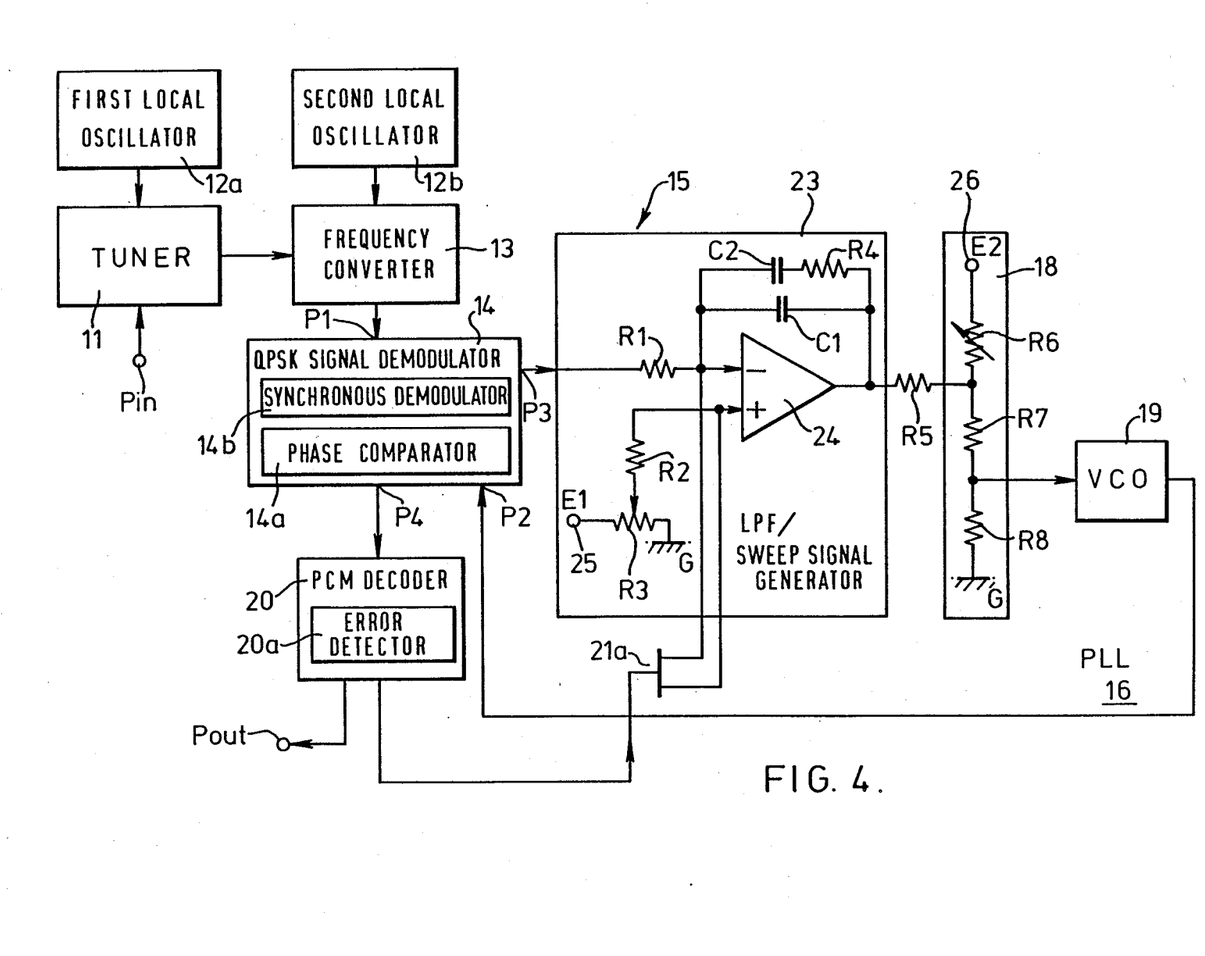
FIG. 4 is a block diagram showing a QPSK system receiver embodying the second embodiment of the phase lock recovery apparatus for a PLL circuit.

Referring now to FIG. 4, a second embodiment of the phase lock recovery apparatus for a PLL circuit according to the present invention will be described in detail. FIG. 4 shows a block diagram of a QPSK system receiver embodying the second embodiment of the phase lock recovery apparatus for PLL circuit.

In FIG. 4, an input terminal Pin is provided for receiving a QPSK modulation wave transmitted from a QPSK signal transmitter (not shown). The QPSK modulation wave input to the input terminal Pin is supplied to a tuner 11. The tuner 11 shifts down a high frequency of the QPSK modulation wave, i.e., an RF signal to a first prescribed IF signal. A first local oscillator 12a supplies a first local frequency signal with a prescribed variable frequency to the tuner 11. The frequency of the first local frequency signal varies in accordance with a tuning operation so that a desired one of the QPSK modulation waves input to the QPSK system receiver is tuned by the tuner 11. Thus, the tuned QPSK modulation wave, i.e., the RF signal is converted to the first IF signal.

The first IF signal output from the tuner 11 is applied to a frequency converter 13. The frequency converter 13 again shifts down the frequency of the first IF signal to a second prescribed IF signal. A second local oscillator 12b supplies a second local frequency signal with a prescribed fixed frequency to the frequency converter 13. The circuit consisting of the tuner 11, the first and second local oscillators 12a, 12b and the frequency converter 13 forms a well-known double frequency conversion system. Thus, the frequency converter 13 outputs a second IF signal lower in frequency than the first IF signal.

The second IF signal is applied to a first input terminal P1 of a QPSK signal demodulator 14. The QPSK signal demodulator 14 constitutes an integrated circuit comprising a phase comparator section 14a and a synchronous demodulator section 14b. The phase comparator section 14a compares the phase of the second IF signal which represents the QPSK modulation signal transmitted from the transmitter with a phase signal as described below, which is supplied to a second input terminal P2 of the QPSK signal demodulator 14. Thus, the phase comparator section 14a outputs a phase error signal between the QPSK modulation signal and the phase signal from a first output terminal P3 of the QPSK signal demodulator 14. The synchronous demodulator section 14b demodulates the PCM signal from the QPSK modulation signal in synchronism with the phase signal.

The QPSK signal demodulator 14 is coupled to a carrier wave reproducing circuit 15. The carrier wave reproducing circuit 15 forms a PLL circuit 16 together with the phase comparator section 14a in the QPSK signal demodulator 14. The carrier wave reproducing circuit 15 comprises a voltage superposing circuit 18, a VCO 19 and a circuit 23 used as both an LPF and a sweep signal generator as described later in detail. The circuit 23 will be referred as an LPF/sweep signal generator hereafter.

The LPF/sweep signal generator 23 comprises an operational amplifier 24, first through fourth resistors R1 through R4 and first and second capacitors C1 and C2. The first resistor R1 is coupled between the first output terminal P3 of the QPSK signal demodulator 14 and an inversion input terminal (−) of the operational amplifier 24. The second resistor R2 is coupled between a movable tap of the third resistor R3 and a non-inversion input terminal (+) of the operational amplifier 24. The third resistor R3 is coupled between a first voltage source 25 with a first voltage E1 and a ground potential source G. The first capacitor C1 is coupled between the inversion input terminal (−) and an output terminal of the operational amplifier 24. A series circuit of the fourth resistor R4 and the second capacitor C2 is coupled between the inversion input terminal (−) and an output terminal of the operational amplifier 24 in parallel with the first capacitor C1. The inversion input terminal (−) and the non-inversion input terminal (+) of the operational amplifier 24 are coupled to the drain and the source of a field effect transistor switch (referred to as FET switch hereinafter) 21a. The gate of the FET switch 21a is coupled to a PCM decoder 20, as described later.

The LPF/sweep signal generator 23 operates as an LPF when the FET switch 21a is OFF. On the other hand, the LPF/sweep signal generator 23 operates as a sweep signal generator when the FET switch 21a is ON. The FET switch 21a is turned ON when an error detection pulse S1 with a high level is applied from the PCM decoder 20.

Now it is assumed that the FET switch 21a is OFF and the LPF/sweep signal generator 23 operates as an LPF. The LPF/sweep signal generator 23 then generates a DC signal having a level variable in correspondence with the phase error signal output from the QPSK signal demodulator 14. The variable DC signal output from the LPF/sweep signal generator 23 is applied to the voltage superposing circuit 18 through a fifth resistor R5.

The voltage superposing circuit 18 includes sixth through eighth resistors R6 through R8. Resistors R6 through R8 are coupled in series between a second voltage source 26 with a second voltage E2 and the ground potential source G in turn. The fifth resistor R5 is coupled to the connection node of the sixth and seventh resistors R6 and R7. The connection node of the seventh and eighth resistors R7 and R8 is coupled to the VCO 19. Thus, the voltage superposing circuit 18 outputs a prescribed fixed voltage divided from the second voltage E2 by the series circuit of the sixth through eighth resistors R6 through R8. The variable DC signal output from the LPF/sweep signal generator 23 is superposed on the second voltage E2 of the second voltage source in the voltage superposing circuit 18. Thus, the voltage superposing circuit 18 outputs a superposed voltage from the connection node of the seventh and eighth resistors R7 and R8. The superposed voltage is applied to the VCO 19.

The VCO 19 oscillates under the control of the superposed voltage supplied from the voltage superposing circuit 18. The VCO 19 is designed to oscillate at an oscillation frequency identical to the frequency of the carrier wave used in the transmitter, when only the fixed voltage based on the second voltage E2 is supplied from the voltage superposing circuit 18, i.e., without the variable DC signal. Thus, the oscillation frequency of a signal, i.e., a VCO signal output from the VCO 19 is corrected so that it is equal in frequency and phase to the carrier wave, in response to the DC signal output from the LPF/sweep signal generator 23.

The VCO signal output from the VCO 19 is fed back to the phase comparator section 14a in the QPSK signal demodulator 14. The PLL circuit 16, comprising the phase comparator section 14a of the QPSK signal demodulator 14 and the carrier wave reproducing circuit 15, automatically stabilizes the phase and the frequency of the VCO signal. As a result, the carrier wave used in the transmitter is reproduced as the VCO signal by the PLL circuit 16 comprising the carrier wave reproducing circuit 15 and the phase comparator section 14a of the QPSK signal demodulator 14.

The carrier wave thus reproduced is supplied to the synchronous demodulator section 14b of the QPSK signal demodulator 14. The synchronous demodulator section 14b demodulates the PCM signal from the QPSK modulation wave applied to the input terminal P1 of the QPSK signal demodulation 14 in accordance with the synchronous demodulation under the control of the reproduced carrier wave. The PCM signal thus demodulated is supplied to the PCM decoder 20. The PCM decoder 20 decodes digital signals from the PCM signal. The digital signals are applied to a digital/analog converter (not shown) for converting the digital signals to corresponding analog signals through an output terminal Pout of the QPSK system receiver.

The PCM decoder 20 includes therein an error detector section 20a. The error detector section 20a detects data errors when the errors occur in the PCM data output from the QPSK signal demodulator 14 or digital data decoded in the PCM decoder 20 itself. The error detector section 20a produces the error detection pulse S1 with the high level when a prescribed amount of the errors is detected. The error detection pulse is applied to the FET switch 21a, as described before.

The errors occur in the PCM data of the digital data, when the PLL circuit 16 goes out of the phase locked state for the QPSK modulation wave, i.e., a phase unlocked state. A large amount of the phase error signal occurs, e.g., at an instant of power ON, during channel switching or upon receipt of a foreign disturbance, as described before.

Figure 5:
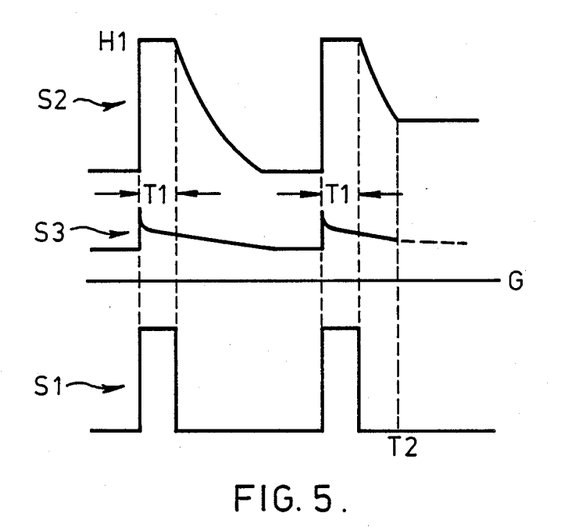
FIG. 5 is a diagram showing signals at a phase lock recovery operation of the apparatus of FIG. 4.

Now the operation of the LPF/sweep signal generator 23 as the sweep signal generator will be described with reference to FIG. 4 and FIG. 5. FIG. 5 is a diagram showing relations among the error detection pulse S1, a potential waveform S3 across the input terminals of the operational amplifier 24 and the sweep signal S2 output from the LPF/sweep signal generator 23.

The FET switch 21a is inserted between the inversion input terminal (−) and the non-inversion input terminal (+) of the operational amplifier 24, as shown in FIG. 4. The FET switch 21a turns ON in response to the error detection pulse S1 output from the PCM decoder 20. During the high level period T1 of the error detection pulse S1, the FET switch 21a is turned ON. Then, the inversion input terminal (−) and the non-inversion input terminal (+) of the operational amplifier 24 are short-circuited. An input stage transistor (not shown) coupled to the inversion input terminal (−) and the non-inversion input terminal (+) is rendered in the unbalanced state. The potential waveform S3, as shown in FIG. 5, appears across the input terminals of the operational amplifier 24. Therefore, the potential of the output terminal of the operational amplifier 24 is clamped at a prescribed high level potential H1, as shown in FIG. 5. When the error detection pulse S1 passes over, the FET switch 21a is turned OFF. Then, the high level potential H1 on the output terminal of the operational amplifier 24 is discharged through the series circuit of the second capacitor C2 and the fourth resistor R4. The time constant of the discharge operation is given by the product of the capacitance and the resistance thereof, i.e., C2.R4. Herein, the references C2 and R4 also represent the capacitance of the second capacitor C2 and the resistance of the fourth resistor R4. Thus, one cycle of the sweep signal S2, as shown in FIG. 5, is generated. The operation for generating the sweep signal S2 is consecutively carried out in response to every error detection pulse S1 applied from the PCM decoder 20. Thus, the LPF/sweep signal generator 23 operates as the sweep signal generator when the PLL circuit 16 has entered into the phase unlocked state. The sweep signal S2 is supplied to the voltage superposing circuit 18. The sweep signal S2 is added to the fixed voltage of the voltage superposing circuit 18 and varies the superposed voltage output from the voltage superposing circuit 18 in accordance with the sweep signal S2. The superposed voltage of the voltage superposing circuit 18 is supplied to the VCO 19. Thus, the oscillation frequency of the VCO signal of the VCO 19 is swept in accordance with the sweep signal supplied from the LPF/sweep signal generator 23. When the sweep voltage supplied from the voltage superposing circuit 18 reaches a prescribed level, the oscillation frequency of the VCO 19 falls into the lock range of the PLL circuit 16. The PLL circuit 16 then operates to lock the oscillation frequency of the VCO 19 to the frequency of the QPSK signals applied to the QPSK signal demodulator 14. Then, the operation of the PLL circuit 16 is in the stable phase locked state.

When the oscillation frequency of the VCO signal thus swept falls into the lock range of the PLL circuit 16 at an instant T2, as shown in FIG. 5, the PLL circuit 16 reproduces the carrier wave. Thus, the QPSK signal demodulator 14 reaches the normal demodulating condition of the correct PCM data. As a result, the error detector section 20a fails to produce the error detection signal and the FET switch 21a is turned OFF. At that time, the LPF/sweep signal generator 23 is changed to the operation state as the LPF.

The sweep signal S2 forcibly varies the oscillation frequency of the VCO 19. If the recovery operation is not achieved within the first cycle of sweep signal S2, the recovery operation can be made at the second or other successive cycles of the sweep signal S2. Thus, the PLL circuit 16 can quickly recover the phase locked state when the oscillation frequency is within the lock range around the frequency of the second IF signal, i.e., the QPSK modulation signal input to the QPSK signal demodulator 14.

According to the second embodiment of the phase lock recovery apparatus for the PLL circuit, the FET switch 21a is turned ON by the error detection pulse S1 output from the PCM decoder 20 to render the LPF/sweep signal generator 23 into operation as the sweep signal generator generating the sweep signal S2, when the PLL circuit 16 has entered into the phase unlocked state. That is, the sweep signal generator is provided by the LPF/sweep signal generator 23 which is used as an LPF constituted in a typical PLL circuit.

As described above, the present invention can provide an extremely preferable phase locked loop circuit, in particular, a phase lock recovery apparatus for a phase locked loop circuit.

The description above illustrates what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiments disclosed as the best mode comtemplated for carrying out the present invention, but that the present invention include all embodiments falling within the scope of the appended claims.

What is claimed is:

1. A phase lock recovery apparatus for a phase locked loop circuit, the phase locked loop circuit comprising:
    a synchronous demodulator section having an output for a demodulated signal;
    a phase comparator having an input for a modulated signal, an input for a phase reference signal, and an output for a phase error signal, said output including a low pass filter;
    a voltage superposing circuit having a fixed DC voltage source and an input coupled to said phase comparator output;
    a voltage controlled oscillator coupled to said superposing circuit, the voltage superposing circuit supplying a superposed voltage to said voltage controlled oscillator; and
    the voltage controlled oscillator having an output which supplies the phase reference signal to the respective phase comparator input;
    the phase lock recovery apparatus comprising:
        detection means coupled to the demodulated output of the synchronous demodulator for detecting a phase unlocked state in the phase locked loop circuit; and
        sweep signal generating means responsive to the detection means for sweeping the frequency of the voltage controlled oscillator to come within the lock range of the frequency of the input signal when the phase unlocked state is detected, wherein the sweep signal generating means includes:
            voltage generating means for supplying a prescribed sweep voltage to the phase locked loop circuit, the voltage generating means having an operational amplifier, discharging means coupled to the operational amplifier for controlling the sweep voltage, and a field effect transistor connected to the operational amplifier for controlling the discharging means.

2. The apparatus as claimed in claim 1, wherein the sweep signal generating means includes voltage generating means within the phase locked loop circuit for generating a prescribed sweep voltage.

3. A phase lock recovery apparatus for a phase locked loop circuit, the phase locked loop circuit comprising:
    a synchronous demodulator section having an output for a demodulated signal;
    a phase comparator having an input for a modulated signal, an input for a phase reference signal, and an output for a phase error signal, said output including a low pass filter;
    a voltage superposing circuit having a fixed DC voltage source and an input coupled to said phase comparator output;
    a voltage controlled oscillator coupled to said superposing circuit, the voltage superposing circuit supplying a superposed voltage to said voltage controlled oscillator;
    the voltage controlled oscillator having an output which supplies the phase reference signal to the respective phase comparator input;
    the phase lock recovery apparatus comprising:
        error detection means coupled to the demodulated output of the synchronous demodulator for detecting the occurrence of a predetermined number of errors in the input signal of the phase locked loop circuit; and
        sweep signal generating means responsive to the error detection means for sweeping the frequency of the voltage controlled oscillator to come within the lock range of the frequency of the input signal when the phase unlocked state is detected, wherein the sweep signal generating means includes:
            voltage generating means for supplying a prescribed sweep voltage to the phase locked loop circuit, the voltage generating means having an operational amplifier, discharging means coupled to the operational amplifier for controlling the sweep voltage, and a field effect transistor connected to the operational amplifier for controlling the discharging means.

4. The apparatus as claimed in claim 3 wherein the sweep signal generating means includes voltage generating means within the phase locked loop circuit for generating a prescribed sweep voltage.

* * * * *